000
United States Patent [19]

Norsworthy

[11] Patent Number: 4,633,107
[45] Date of Patent: Dec. 30, 1986

[54] CMOS POWER-UP RESET CIRCUIT FOR GATE ARRAYS AND STANDARD CELLS

[75] Inventor: Steven R. Norsworthy, Palm Bay, Fla.

[73] Assignee: Harris Corporation, Melbourne, Fla.

[21] Appl. No.: 673,386

[22] Filed: Nov. 20, 1984

[51] Int. Cl.[4] .............................................. H03K 17/22
[52] U.S. Cl. ................................. 307/594; 307/200 B; 307/246; 307/592; 307/601
[58] Field of Search ................... 307/200 B, 359, 576, 307/579, 585, 592, 594, 597, 601, 603, 605, 296 R, 246

[56] References Cited

U.S. PATENT DOCUMENTS

| | | | |
|---|---|---|---|
| 3,895,239 | 7/1975 | Alaspa | 307/296 R X |
| 4,001,609 | 1/1977 | Sickert | 307/296 R X |
| 4,045,688 | 8/1977 | Stewart | 307/585 |
| 4,140,930 | 2/1979 | Tanaka | 307/585 X |
| 4,409,501 | 10/1983 | Eickerman et al. | 307/585 X |
| 4,558,233 | 12/1985 | Nakamori | 307/594 X |

FOREIGN PATENT DOCUMENTS 0047727  4/1980  Japan ................................. 307/594

Primary Examiner—Stanley D. Miller
Assistant Examiner—D. R. Hudspeth
Attorney, Agent, or Firm—Barnes & Thornburg

[57] ABSTRACT

A power-up reset circuit has a first circuit for sensing a source voltage potential and generating a reset signal at an output when the source voltage potential rises above a threshold level. An input of the sensing circuit is coupled to the source voltage potential to permit a voltage at the sensing circuit's input to follow the source voltage potential during an initial rise of the source voltage potential. The power-up reset circuit further has a second circuit for sensing the source voltage potential and generating a time delayed signal at an output when the source voltage potential rises above a predetermined level. A termination circuit has an input coupled to the output of the second circuit and generates a termination signal at an output coupled to the input of the first circuit to terminate the reset signal in response to the time delayed signal. A feedback switch has an input coupled to the output of the first circuit and couples the terminating circuit to the source voltage potential in response to the reset signal and decouples the terminating circuit from the source voltage potential in response to the termination of the reset signal.

22 Claims, 5 Drawing Figures

CMOS POWER-UP RESET CIRCUIT FOR GATE ARRAYS AND STANDARD CELLS

BACKGROUND AND SUMMARY OF THE INVENTION

This invention relates to power-up reset circuits for logic circuits, and more particularly, to power-up reset circuits for use with power supplies of any given ramp rate.

In certain integrated circuit (IC) design applications, it is desirable or even necessary to provide a reset signal for certain types of logic elements. These logic elements are typically memory circuits of one type or another which will remain in a certain state once having been set to that state. Such elements are flip-flops, counters, timers and other similar circuits. To ensure proper operation of the circuit which contains such elements, a reset signal is typically provided during power-up of the circuit to set these elements to a certain desired condition. Normally, it is desirable to have this reset occur automatically during power-up, that is, during the period of time when the voltage from the power supply is transitioning from zero volts to the nominal voltage used to power the circuit.

Although power-up reset circuits which automatically generate a reset signal during power-up are known, these circuits have exhibited several problems. In many cases, the power-up circuit is useful only with power supplies having a certain ramp rate. The term ramp rate is used to describe the rate at which the voltage output level of the power supply changes from zero to its nominal voltage from the time it is turned on until it reaches a steady state condition. Another problem exhibited by many existing power-up reset circuits is that they continue to draw power even after the reset signal has been generated. This is particularly undesirable for CMOS circuits which are battery powered. A further problem that many of these reset circuits have exhibited is that they require certain passive components such as resistors or capacitors in addition to standard geometry devices such as MOSFETs. Consequently, more sophisticated and expensive manufacturing processes for generating the integrated circuit must be utilized to integrate the passive components with the standard geometry devices. For CMOS Gate Array/Standard Cell implementations which are manufactured using basic CMOS processing techniques, the passive components cannot be integrated with the standard geometry devices and must be provided externally.

It is therefore an object of the invention to provide a power-up reset circuit which is functionally independent of the ramp rate of the power supply used.

It is another object of the invention to provide a power-up reset circuit which draws little or no stand-by current.

It is a further object of the invention to provide a power-up reset circuit which is easily implemented for either a CMOS Gate Array or a CMOS Standard Cell utilizing basic CMOS processing techniques.

It is an additional object of the invention to provide a power-up reset circuit which can be implemented on a relatively small die area.

Another object of the invention is to provide a power-up reset circuit whose functionality is independent of the typical range of process variations and temperature range applications.

A power-up reset circuit of this invention generates a reset signal during a power-up cycle of a power supply having a source voltage potential and a source voltage reference. A first means senses the source voltage potential and generates the reset signal at an output when the source voltage potential rises above a threshold level. The power-up reset circuit further has means for coupling an input of the first sensing means to the source voltage potential to permit a voltage at the first sensing means' input to follow the source voltage potential during an initial rise of the source voltage potential. A second sensing means senses the source voltage potential and generates a time delayed signal at an output when the source voltage potential rises above a predetermined level. A terminating means has an input coupled to the output of the second sensing means and generates a termination signal at an output coupled to the input of the first sensing means to terminate the reset signal in response to the time delayed signal. A feedback switch has an input coupled to the output of the first sensing means and couples the terminating means to one of the source voltage potential and the source voltage reference in response to the reset signal and decouples the terminating means from the one of the source voltage potential and source voltage reference in response to the termination of the reset signal.

Other objects, advantages and novel features of the present invention will become apparent from the following detailed description of the invention when considered in conjunction with the accompanying drawings.

DETAILED DESCRIPTION OF THE DRAWINGS

Figure 1:
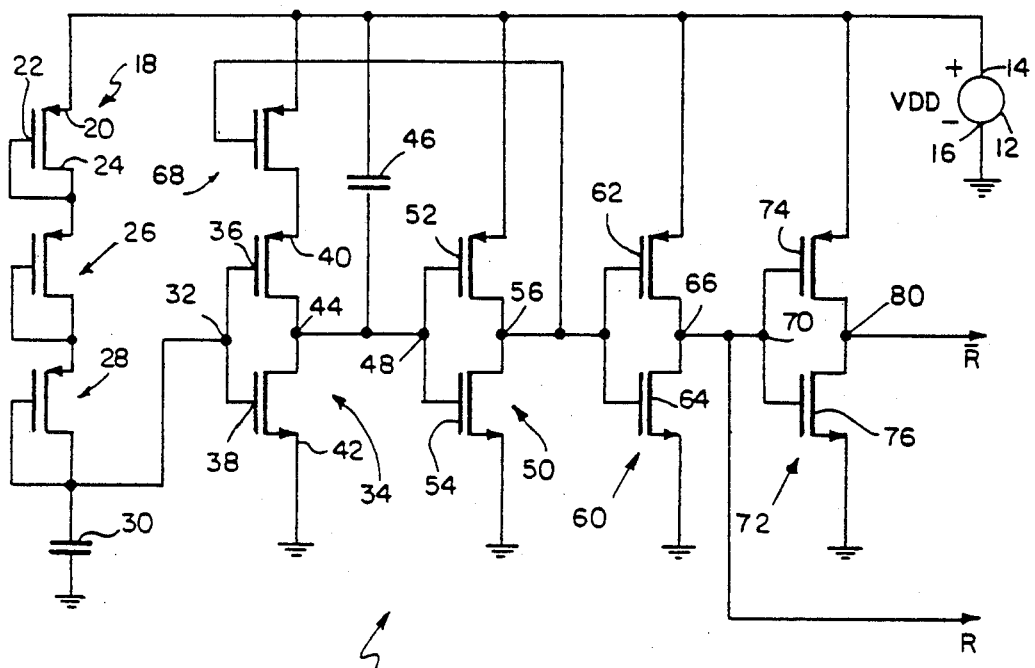
FIG. 1 is a circuit schematic of the invention.

Referring to FIG. 1, a power-up reset circuit 10 is shown connected to power supply 12 which has a source voltage potential terminal 14 and a source voltage reference terminal 16. Illustratively, power supply 12 provides a source voltage potential at source voltage potential terminal 14 and the source voltage reference terminal 16 is connected to ground. The source voltage potential provided at source voltage potential terminal 14 of power supply 12 will hereinafter be referred to as VDD.

A source voltage potential sensing and delay circuit has P-Channel MOSFETS 18, 26, 28 and a capacitor 30. P-Channel MOSFET 18 has its source 20 connected to VDD and its gate 22 connected to its drain 24. A MOSFET connected in the manner just described is typically referred to as a diode-connected MOSFET. MOSFETs 26 and 28 are also P-Channel diode-connected MOSFETs. The source of MOSFET 26 is coupled to the drain of MOSFET 18 and the drain of MOSFET 26 is coupled to the source of MOSFET 28. The drain of MOSFET 28 is connected to one side of capacitor 30 and to an input 32 of a CMOS inverter 34.

CMOS inverter 34 comprises a threshold detection and terminating circuit and consists of a P-Channel MOSFET 36 and an N-Channel MOSFET 38. The source of P-Channel MOSFET 36 provides a source voltage potential terminal 40 for inverter 34 which is coupled to VDD by a feedback switch, feedback MOSFET 68. The source of N-Channel MOSFET 38 provides a source voltage reference terminal 42 for inverter 34. Terminals 40, 42 comprise power supply terminals for threshold detection inverter 34. The gate of MOSFETs 36, 38 are connected together and form the input 32 of CMOS inverter 34. The drains for MOSFETs 36, 38 are also connected together and provide an output 44 of CMOS inverter 34.

Output 44 of CMOS inverter 34 is coupled by a capacitor 46 to VDD. Output 44 is also connected to an input, illustratively input 48 of CMOS inverter 50, of a wave shaping circuit which includes CMOS inverters 50, 60, and 72. As is conventional, CMOS inverter 50 is formed from a P-Channel MOSFET 52 and an N-Channel MOSFET 54. The source of MOSFET 52 is connected to VDD and the source of MOSFET 54 is connected to ground. The gates of MOSFETs 52, 54 are connected together and form input 48 and the drains of MOSFETs 52, 54 are connected together to provide an output 56 for inverter 50.

The output 56 of inverter 50 is coupled to an input 58 of CMOS inverter 60. Inverter 60 is formed from a P-Channel MOSFET 62 which has its source connected to VDD and a N-Channel MOSFET 64 which has its source connected to ground. The gates of MOSFETs 62, 64 are connected together to form input 58 and the drains of MOSFETs 62, 64 are connected together to provide an output 66 for inverter 60. Illustratively, a reset signal R is generated at output 66 of inverter 60 as will be described in greater detail later.

Output 56 of inverter 50 is also connected to an input of the feedback switch, the gate of feedback P-Channel MOSFET 68. The source of MOSFET 68 is connected to VDD and the drain of MOSFET 68 is connected to the source voltage potential terminal 40 of inverter 34. MOSFET 68 forms the feedback switch which is coupled in series with the power supply terminals 40, 42 of inverter 34 between the source voltage potential VDD and the source voltage reference, ground.

Output 66 of inverter 60 is connected to an input 70 of a CMOS inverter 72. Inverter 72 is formed from a P-Channel MOSFET 74 which has its source connected to VDD and a N-Channel MOSFET 76 which has its source connected to ground. The gates of MOSFETs 74, 76 are connected together to form input 70 and the drains of MOSFETs 74, 76 are connected together to provide an output 80 for inverter 72. Illustratively, an inverse reset signal R of the reset signal R generated at output 66 of inverter 60 is generated at output 80 of inverter 72.

In operation, when the power supply 12 is turned on, the voltage at input 48 of inverter 50 will be brought to VDD through capacitor 46 as VDD rises. Therefore, as soon as VDD is higher than the threshold voltage for MOSFET 54 (illustratively 0.7 volts), MOSFET 54 will be turned on thereby pulling output 56 of inverter 50 to ground. Since input 48, the gate of MOSFET 52, of inverter 50 will be at VDD, as will the source of P-Channel MOSFET 52, MOSFET 52 will be biased off.

The low signal at output 56, which is connected to the gate of feedback P-Channel MOSFET 68, will cause feedback MOSFET 68 to turn on thereby connecting inverter 34 to VDD. Input 32 of inverter 34 will be low at this point thereby forcing output 44 of inverter 34 high to ensure that input 48 of inverter 50 remains at VDD until inverter 34 changes states. The low signal at output 56 will also cause inverter 60 to generate a high signal at output 66 which in turn causes a low signal to be generated at output 80 of inverter 72. Therefore, reset signal R will be high and its inverse R at output 80 will be low. It should be understood that output 44 of inverter 34 could also provide the reset signal although wave-shaping inverters 50, 60, and 72 will generate a reset pulse having a more optimum wave shape.

After VDD has reached a level which is high enough to overcome the thresholds of MOSFETs 18, 26, 28, capacitor 30 will begin to charge and the voltage at input 32 of inverter 34 will begin to rise. This will occur when VDD reaches approximately 3 VDC.

When the voltage at input 32 reaches approximately 1.8 VDC, inverter 34 will change states wherein MOSFET 38 will be turned on and MOSFET 36 will be biased off. MOSFET 38 will pull output 44 of inverter 34 to ground as soon as it is turned on. This will cause capacitor 46 to begin to discharge and input 48 of inverter 50 to be pulled low. This in turn causes inverters 50, 60, and 72 to change states. Output 56 of inverter 50 will go high, output 66 of inverter 60 will go low terminating reset signal R, and output 80 of inverter 72 will go high terminating the inverse reset signal R. As soon as output 56 of inverter 50 goes high, feedback MOSFET 68 will be biased off thereby disconnecting inverter 34 from VDD. Therefore, at this point in time no current will be flowing through MOFSFETs 68, 36, 38. The voltage level at input 32 of inverter 34 will continue to rise until it reaches VDD, at which point there will be no current flowing through MOSFETs 18, 26, 28.

By disconnecting inverter 34 from VDD as soon as the reset signal R is terminated, the current which would normally flow from VDD through MOSFETs 36, 38 will be eliminated thereby ensuring minimal power dissipation. This eliminates the problem which occurs if the feedback switch is not utilized wherein MOSFET 36 of inverter 34 would not be fully turned off even though the voltage level at input 32 had reached a sufficiently high level to turn MOSFET 38 on, which pulls output 44 of inverter 34 low.

MOSFET 36 would not be fully turned off until the voltage level at input 32 reaches VDD. Therefore, during the time period that capacitor 30 continues to charge towards VDD after the voltage level at input 32 has reached the threshold level to cause inverter 34 to switch, current will not be flowing from VDD to ground through inverter 34. It should be understood that MOSFETs 18, 26, 28 effectively form an equivalent resistance which coacts with capacitor 30 so that the time it takes for the voltage level at input 32 to reach its various levels is determined by the RC time constant of capacitor 30 and the equivalant resistance of MOSFETs 18, 26, 38.

By using three MOSFETs (18, 26, 28) to provide the equivalent resistance, the reset circuit becomes functionally independent of the power supply's ramp rate as shown by the simulation results discussed later. Further, using three MOSFETs (18, 26, 28) makes the circuit insensitive to temperature variations over at least the MIL-SPEC range, −55° C. to +125° C.

Figure 2:
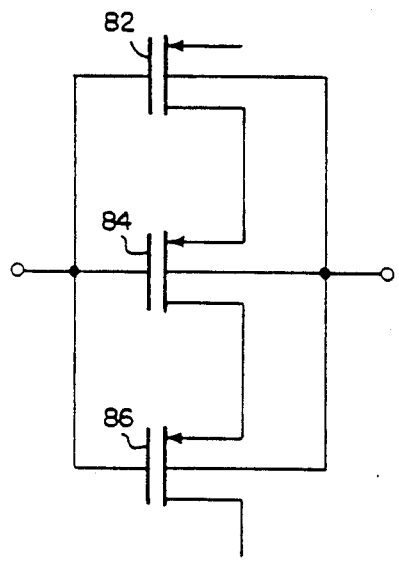
FIG. 2 is a schematic of P-Channel MOSFETs connected to form a capacitor.

Referring to FIG. 2, a capacitor formed from P-Channel MOSFETs is shown. Illustratively, the capacitor is formed from three P-Channel MOSFETs 82, 84, 86. The source of MOSFET 82 is left floating while the drain of MOSFET 82 is connected to the source of MOSFET 84. The drain of MOSFET 84 is connected to the source of MOSFET 86 while the drain of MOSFET 86 is left floating. The gates of MOSFETs 82, 84, 86 are connected together and form one side of the capacitor. The substrates of MOSFETs 82, 84, 86 are also connected together and form the other side of the capacitor. Illustratively, a capacitor formed from P-Channel MOSFETs could be utilized for capacitor 46 wherein the interconnected gates would be coupled to input 48 of inverter 50 and the interconnected substrates would be connected to VDD.

Figure 3:
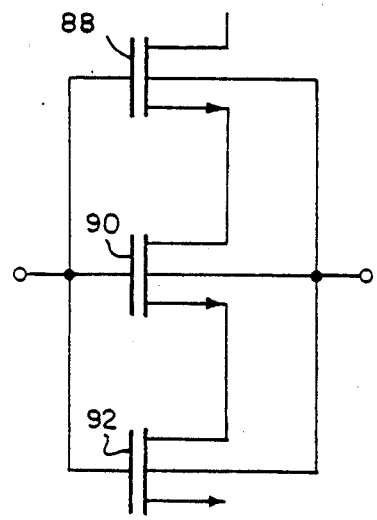
FIG. 3 is a schematic of N-Channel MOSFETs connected to form a capacitor.

Referring to FIG. 3, a capacitor formed from N-Channel MOSFET's is shown. Illustratively, the capacitor is formed from three N-Channel MOSFETs 88, 90, 92. The drain of MOSFET 88 is left floating while the source of MOSFET 88 is connected to the drain of MOSFET 90. The source of MOSFET 90 is connected to the drain of MOSFET 92 while the source of MOSFET 92 is left floating. The gates of MOSFETs 88, 90, 92 are connected together to form one side of the capacitor while the substrates of MOSFET 88, 90, 92 are connected together to form the other side of the capacitor. Illustratively, the capacitor formed from N-Channel MOSFETs could be utilized as capacitor 30 with the interconnected gates connected to input 32 of inverter 34 and the connected together substrates connected to ground.

The circuit herein described was simulated using the SLICE simulation program of Harris Semiconductor. Illustratively, MOSFETs 18, 26, 28, 36, 52, and 68 have device values of W/L=30 um/4 um (where W and L are the channel width and length, respectively), MOSFETs 62 and 74 have device values of W/L=90um/4um, MOSFETs 38, 54 have device values of W/L=30um/3um, MOSFETs 64, 76 have device values of W/L=60 um/3 um, and capacitors 30 and 46 are approximately 1 pF.

Figure 4:
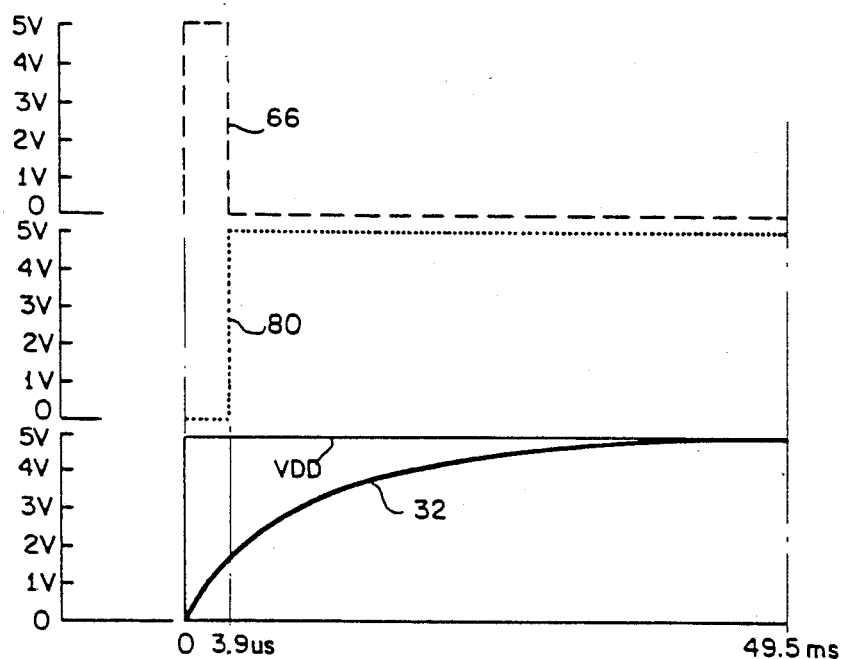
FIG. 4 is a timing diagram illustrating the operation of the invention with a power supply having a step-function ramp rate.

Referring to FIG. 4, a timing diagram for the circuit of FIG. 1 having the values as just described for a power supply having a step-function ramp rate is shown. At time zero, VDD jumps to 5 volts. Input 48 of inverter 50 will follow VDD to 5 volts virtually simultaneously. This will force output 56 low, output 66 high, and output 80 low, thereby generating a high reset signal R at output 66 and its inverse R at output 80. The gate to MOSFET 66 will also be brought low, thereby biasing MOSFET 68 on which connects VDD to inverter 34. At approximately 3.9 us, the voltage level at input 32 of inverter 54 will have risen to approximately 1.8 volts at which time it forces inverter 34 to change states. Output 44 is brought low forcing output 56 high, output 66 low, and output 80 high, thereby terminating the reset signal R. The gate of MOSFET 68 will also be brought high biasing MOSFET 68 off, thereby disconnecting inverter 34 from VDD. The voltage at input 32 will continue to rise to VDD. By disconnecting inverter 34 from VDD as soon as the reset signal R is terminated, virtually all standby current draw in circuit 10 is eliminated as soon as the reset signal is terminated.

Figure 5:
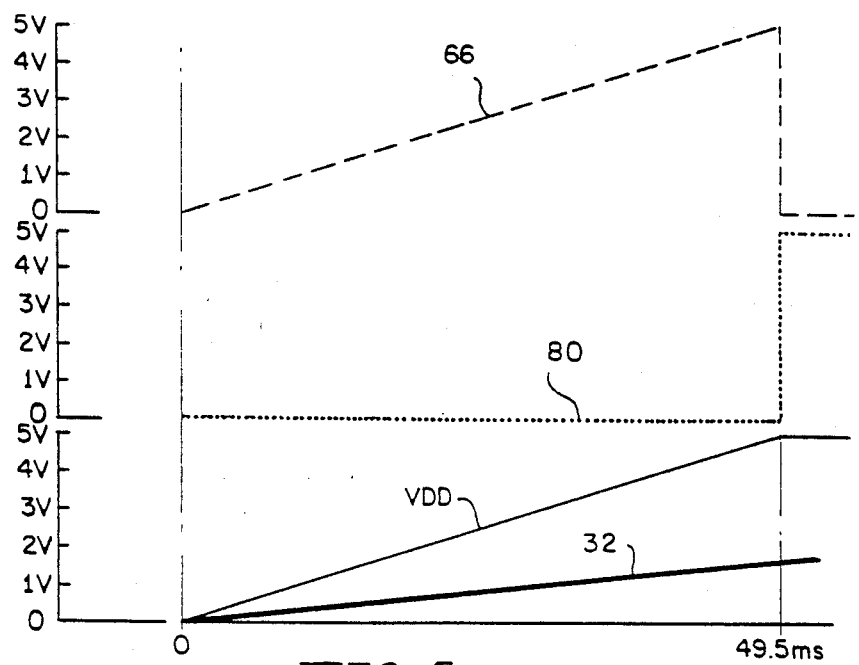
FIG. 5 is a timing diagram illustrating the operation of the invention with a power supply having a linear ramp rate.

Referring to FIG. 5, a timing diagram for a power supply having a linear ramp rate is shown. The voltage at input 48 of inverter 50 will follow VDD high. As soon as VDD rises above the threshold voltage for MOSFET 54 (illustratively 0.7 volts), the output 56 of inverter 54 will be brought low turning MOSFET 68 on and also forcing output 66 of inverter 60 high and output 80 of inverter 70 low. At this point, reset signal R at output 66 and its inverse R at output 80 will be generated. After approximately 49.5 ms, the voltage level at input 32 will have reached approximately 1.8 VDC at which time inverter 34 will change states. Output 44 is brought low forcing output 56 of inverter 56 high turning MOSFET 68 off and also forcing output 66 low and output 80 high. This terminates the reset signal R and also disconnects inverter 34 from VDD so that no current can flow through inverter 34 while the voltage at input 34 continues to rise to VDD. Therefore, stand-by current flow through these devices is virtually eliminated as soon as the reset signal is terminated.

A similation was run taking thresholds of the devices at their lowest and highest values (0.6 V through 1.1 V). Very satisfactory results similar to those discussed with reference to FIG. 4 and FIG. 5 were obtained. Similar results were also obtained when taking the nominal voltage for VDD as 4.5 V and for the case where temperature is varied from −55° C. to +125° C.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A power-up reset circuit, comprising means coupled to a source voltage potential for sensing the source voltage potential and providing a time-delayed signal at an output in response thereto;

a threshold detection inverter having an input coupled to the output of the time delay means and having power supply terminals and an output;

a feedback switch coupled in series with the threshold detection inverter's power supply terminals between the source voltage potential and a source voltage reference;

a wave-shaping circuit having an input coupled to the output of the threshold detection inverter for providing a reset signal at an output;

means for coupling the input of the wave-shaping circuit to the source voltage potential to permit a voltage at the input of the wave-shaping circuit to follow the source voltage potential during an initial rise of the source voltage potential; and means for coupling an output of the wave-shaping circuit to an input of the feedback switch.

2. The circuit of claim 1 wherein the feedback switch is coupled in series with a source voltage potential terminal of the threshold detection inverter's power supply terminals and the source voltage potential.

3. The circuit of claim 1 wherein the source voltage potential sensing means comprises a plurality of diode-connected MOSFETs coupled in series between the source voltage potential and the threshold detection inverter's input, the sensing means further including a capacitor coupled between the threshold detection inverter's input and the source voltage reference.

4. The circuit of claim 3 wherein the capacitor comprises a MOSFET capacitor.

5. The circuit of claim 3 wherein the plurality of diode-connected MOSFETs comprise at least three diode-connected MOSFETs.

6. The circuit of claim 5 wherein the feedback switch is coupled in series with a source voltage potential terminal of the threshold detection inverter's power supply terminals and the source voltage potential.

7. The circuit of claim 1 wherein the wave shaping circuit comprises a plurality of successively coupled inverters, an output of each inverter being coupled to an input of the next inverter in the succession, an input of the first inverter in the succession being coupled to the output of the threshold detection inverter, the outputs of the successively coupled inverters providing outputs for the wave shaping circuit.

8. The circuit of claim 7 wherein the feedback switch includes an input coupled to the output of the first successively coupled inverter of the wave shaping circuit.

9. The circuit of claim 8 wherein the feedback switch is coupled in series with a source voltage potential terminal of the threshold detection inverter's power supply terminals and the source voltage potential.

10. The circuit of claim 9 wherein the source voltage potential sensing means comprises a plurality of diode-connected MOSFETs coupled in series between the source voltage potential and the threshold detection inverter's input, the sensing means further including a capacitor coupled between the threshold detection inverter's input and the source voltage reference.

11. The circuit of claim 10 wherein means for coupling the input of the wave-shaping circuit to the source voltage potential comprises a capacitor.

12. The circuit of claim 11 wherein each inverter comprises a CMOS inverter, each capacitor comprises a MOSFET capacitor, and the feedback switch comprises a MOSFET.

13. A power-up reset circuit for gate arrays and standard cells, comprising
 a plurality of diode connected MOSFETs connected in series between a source voltage potential and a circuit node;
 a first capacitor coupled between the circuit node and a source voltage reference;
 a CMOS inverter for detecting a threshold voltage at the circuit node having a source voltage terminal connected to the source voltage potential through a feedback switch, a source voltage reference terminal connected to the source voltage reference, an input connected to the circuit node and an output; and
 a wave shaping circuit having outputs and an input coupled to the output of the threshold detection inverter and to the source voltage potential through a second capacitor;
 a reset pulse being generated at one of the outputs of the wave shaping circuit, and the feedback switch having an input coupled to an output of the wave shaping circuit.

14. The circuit of claim 13 wherein the feedback switch comprises a P-channel MOSFET having a source connected to the source voltage potential, a drain connected to the source voltage potential terminal of the threshold detection inverter, and a gate connected to an output of the wave shaping circuit.

15. The circuit of claim 14 wherein the first and second capacitors comprise MOSFET capacitors.

16. The circuit of claim 15 wherein the wave shaping circuit comprises a plurality of successively connected CMOS inverters, an output of each inverter connected to an input of the next inverter in the wave shaping circuit, the input of the first inverter coupled to the output of the threshold detection inverter, the output of the first inverter connected to the gate of the MOSFET feedback switch and the outputs of the inverters in the wave shaping circuit providing the outputs for the wave shaping circuit.

17. The circuit of claim 16 wherein there are three successively connected inverters which comprise the wave shaping circuit, the output of the second successively connected inverter providing a reset output, R, and the output of the third successive connected inverter providing an inverse reset output, $\overline{R}$.

18. A power-up reset circuit, comprising
 means for sensing a source voltage potential and providing a time-delayed signal at an output in response thereto;
 a first inverter having an input coupled to the output of the time delay means, an output, and power supply terminals;
 means for enabling and disabling the first inverter having a control input and coupled in series with the power supply terminals of the first inverter between the source voltage potential and a source voltage reference;
 a second inverter having an input coupled to the output of the first inverter and an output coupled to the enabling means' control input; and
 means for coupling the input of the second inverter to the source voltage potential to permit a voltage at the input of the second inverter to follow a change in the source voltage potential;
 the output of at least one of the first and second inverters providing a reset signal.

19. A power-up reset circuit for generating a reset signal during a power-up cycle of a power supply having a source voltage potential and a source voltage reference, comprising
 first means for sensing the source voltage potential and generating the reset signal at an output when the source voltage potential rises above a threshold level;
 means for coupling an input of the first sensing means to the source voltage potential to permit a voltage at the first sensing means' input to follow the source voltage potential during an initial rise of the source voltage potential;
 second means for sensing the source voltage potential and generating a time delayed signal at an output when the source voltage potential rises above a predetermined level;
 means having an input coupled to the output of the second sensing means for generating a termination signal at an output coupled to the input of the first sensing means for terminating the reset signal in response to the time delayed signal; and
 means having an input coupled to the output of the first sensing means for coupling the terminating means to one of the source voltage potential and the source voltage reference in response to the reset signal and decoupling the terminating means from the one of the source voltage potential and source voltage reference in response to the termination of the reset signal.

20. The circuit of claim 19 wherein the second sensing means comprises a plurality of diode-connected MOSFETs connected together in series and connected in series with a capacitor between the source voltage potential and the source voltage reference, the output of the second sensing means comprising the connection between the diode-connected MOSFETs and the capacitor.

21. The circuit of claim 20 wherein the diode-connected MOSFETs have an equivalent resistance, the time delay before the time delayed signal is generated being determined by the RC time constant where R is the equivalent resistance of the diode-connected MOSFETs and C is the capacitance of the capacitor.

22. The circuit of claim 21 wherein the RC time constant is on the order of 3.6 micro-seconds.

* * * * *